(12) United States Patent
Shan

(10) Patent No.: US 10,148,199 B1
(45) Date of Patent: Dec. 4, 2018

(54) LOOP-BAND DEVICES CONFIGURED FOR MOTION

(71) Applicant: Baoxiang Shan, Hoboken, NJ (US)

(72) Inventor: Baoxiang Shan, Hoboken, NJ (US)

(*) Notice: Subject to any disclaimer, the term of this patent is extended or adjusted under 35 U.S.C. 154(b) by 0 days.

(21) Appl. No.: 15/802,580

(22) Filed: Nov. 3, 2017

Related U.S. Application Data

(60) Provisional application No. 62/506,199, filed on May 15, 2017, provisional application No. 62/506,828, filed on May 16, 2017, provisional application No. 62/507,300, filed on May 17, 2017, provisional application No. 62/509,102, filed on May 20, 2017.

(51) Int. Cl.
  *H02N 2/10* (2006.01)
  *B23Q 1/28* (2006.01)
  *E05B 17/20* (2006.01)

(52) U.S. Cl.
  CPC ............... *H02N 2/10* (2013.01); *B23Q 1/28* (2013.01); *E05B 17/2084* (2013.01)

(58) Field of Classification Search
  CPC ........ H02N 2/10; H02N 2/0015; H02N 2/006; H02N 2/12; H02N 2/123; H01L 41/0926; H01L 41/096
  USPC .......................................... 310/328, 330–332
  See application file for complete search history.

(56) References Cited

U.S. PATENT DOCUMENTS

| | | | |
|---|---|---|---|
| 6,327,909 B1 | 12/2001 | Hung | |
| 6,392,331 B1 | 5/2002 | Sciacca | |
| 8,584,456 B1 | 11/2013 | McKnight | |
| 9,744,563 B2 | 8/2017 | Benjamin | |
| 2010/0164326 A1* | 7/2010 | Ebihara | H02N 2/101 310/323.02 |
| 2011/0241484 A1* | 10/2011 | Okada | H02N 2/105 310/323.02 |
| 2011/0241485 A1* | 10/2011 | Nagase | H02N 2/101 310/323.02 |
| 2013/0082427 A1 | 4/2013 | Zavattieri | |

* cited by examiner

*Primary Examiner* — Derek Rosenau
(74) *Attorney, Agent, or Firm* — r.r (princeton); Roy Rosser

(57) ABSTRACT

A method of providing motion using a loop-band device is disclosed. An outer, restraining loop constrains an inner, buckling loop to form a buckled mode having one or more buckles. An activation force generated in one of buckles provides a stress, resulting in a change of configuration of the buckling loop that produces movement of the restraining loop. Depending on the composition of the buckling loop, the stress is generated via heat, light, an electric current or voltage, a magnetic field, or a combination thereof. The restraining loop is a suitably thin, relatively inextensible but flexible material. The buckling loop is a suitably thin, relatively flexible, reactive material that develops stress when subject to suitable activation forces. Suitable reactive materials include electroactive polymers, electrostrictive materials, magnetostrictive materials and materials having a high coefficient of linear, thermal expansion. The motion is linear or rotary, depending on device configuration.

20 Claims, 5 Drawing Sheets

LOOP-BAND DEVICES CONFIGURED FOR MOTION

CROSS-REFERENCE TO RELATED APPLICATIONS

This application claims priority to U.S. Ser. No. 62/506,199 entitled "Looped Multistable System" filed on May 15, 2017 by Baoxiang Shan; to U.S. Ser. No. 62/506,828 entitled "Flexible Actuator and Sensor" filed on May 16, 2017 by Baoxiang Shan; to U.S. Ser. No. 62/507,300 entitled "Flexible Movement System" filed on May 17, 2017 by Baoxiang Shan; and to U.S. Ser. No. 62/509,102 entitled "Travelling Wave Pumps" filed on May 20, 2017 by Baoxiang Shan, the contents of all of which are hereby fully incorporated herein by reference.

BACKGROUND OF THE INVENTION (1) Field of the Invention

The invention relates to loop-band devices configured for producing motion, and more particularly to loop-band devices configured to convert thermal, piezo-electric, electro-restrictive and magneto-restrictive stresses into mechanical motion, and vice-versa.

(2) Description of the Related Art

The technical problems of converting thermal, piezo-electric, electro-restrictive and magneto-restrictive stresses into mechanical motion, and vice-versa, are inherent in the technical fields of motion generation and energy harvesting.

The relevant prior art includes:

U.S. Pat. No. 6,392,331 issued to Sciacca, et al. on May 21, 2002 entitled "Bistable actuator" that describes a bistable actuator for residual-current devices, including a lamina having at least one face, a first end, and a second end, and configured to actuate from a first stable position to a second stable position; at least one layer of piezoelectric material provided on the at least one face of the lamina at the first end of the lamina, and configured to stimulate the lamina to shift from the first stable position to the second stable position in response to an electrical activation signal; and a support element including an interlock coupling, and configured to support the first end and the second end of the lamina, wherein the interlock coupling is configured to interlock the first end of the lamina to the support element, and the second end of the lamina is rigidly coupled to the support element in order to keep the lamina in the first stable position.

US Patent Application 20130082427 published by Zavattieri et al. on Apr. 4, 2013 entitled "Bi-Stable and Multi-Stable Devices" that describes a bi-stable or multi-stable device having two or more stable positions includes an elastically deformable member having two or more stable positions of minimal potential energy, the deformable member being movable, in response to an external force generated to the deformable member, between stable positions by moving through a position at which the deformable member has a peak potential energy. The device also includes an energy storage member, either separate from or part of the deformable member, that absorbs energy from the external force generated to the deformable member as the deformable member moves from a stable position toward a position of peak potential energy, and releases energy as the deformable member moves from a position of peak potential energy toward a stable position, wherein the energy storage member includes a super elastic shape memory alloy (SMA).

Various implementations are known in the art, but fail to address all of the problems solved by the invention described herein. Various embodiments of this invention are illustrated in the accompanying drawings and will be described in more detail herein below.

BRIEF SUMMARY OF THE INVENTION

An inventive system and method of providing motion using a loop-band device is disclosed.

In a preferred embodiment, the loop-band device may include a restraining loop that may retain a buckling loop such that the buckling loop assumes, or forms, a buckled mode having one or more buckles. An activation force may then be generated within the buckling loop. The activation force may, for instance, be any force that results in a change of stress in the buckling loop. Depending on the composition of the buckling loop that stress may be generated via a means such as, but not limited to, heat, light, an electric current or voltage, a magnetic field, or a combination thereof. The result of the stress may be a change in the configuration of the buckling loop such that there is a movement of, or relative to, the restraining loop.

In a more preferred embodiment, activation force may be applied at, or in, the vicinity of an inflection point of one or more of the buckles, as this may result in a more effective translation of activation force into loop-band device motion.

The restraining loop preferably is preferably a continuous ribbon, having no end point, that may have a uniform thickness and a uniform width. The width of the restraining loop is preferably greater than its thickness, and, the restraining loop is preferably of homogenous composition.

The restraining loop may, for instance, be made of a relatively inextensible but flexible material such as, but not limited to, a fabric reinforced silicone, a fabric reinforced polyurethane, a Titanium alloy, a stainless steel alloy, a copper alloy or an aluminum alloy, or a combination thereof.

The buckling loop is preferably a continuous ribbon, having no end point, that may have a uniform thickness and a uniform width. The width of the buckling loop is preferably greater than the thickness of the buckling loop. While the buckling loop may be of homogenous composition, some embodiments may have buckling loops having a patterning of varying composition.

The buckling loop may, for instance, be made of a relatively flexible material that may develop stresses when subject to suitable activation forces. Such materials include, for instance, electroactive polymers such as, but not limited to, electrostrictive materials having a piezoelectric voltage constant greater than $1 \times 10^{-3}$ Vm/N, magnetostrictive materials having a magnetostrictive coefficient greater than 50 microstrains, or a combination thereof. Other suitable buckling loop materials include, but are not limited to, metals, or metal alloys, having a coefficient of linear, thermal expansion greater than $5 \times 10^{-6}$ m/m/° C.

Both the restraining and the buckling loops are preferably of seamless construction, though allowances for the manufacturing tolerances of joints may be made.

In a further preferred embodiment of the invention, the bucking loop may be a bilayer buckling loop having a substrate layer and an active material layer. The substrate layer and the active material layer may, for instance, be joined together. The substrate layer may be made of materials such as, or similar to, those of which the restraining loop may be made. Similarly, the active material layer may be made of materials such as, or similar to, those of which the buckling loop may be made.

In another embodiment of the invention, the restraining loop may include one or more engagement elements while the buckling loop may include one or more complementary locating elements. Such an arrangement may, for instance, allow the buckling loop to assume more complex, higher eigenvalue modes that may have a greater number of buckles. The complementary engagement and locating elements may also, or instead, help transfer forces and/or motion between the restraining and buckling loops.

Further embodiments may include fixation points that may tie the restraining loop to the buckling loops at one or more points of fixation. Such fixation points may, for instance, be effective in allowing the loop-band device to be used to generate lateral motions that may, for instance, be useful in applications such as, but not limited to, robotic arm articulation.

In yet another embodiment of the invention, the buckling loop may be provided with one or more discrete force generating elements that may be individually activated, or activated in groups. These force generating elements may be materials such as, but not limited to, ceramic or polymer piezoelectric elements.

One of ordinary skill in the art will appreciate that while the loop-band devices are described herein primarily in terms of stresses being applied to the buckling loop to generate motion, many of the embodiments described may also be used in a further, or alternate, mode in which the loop-band device, or elements of it, are subject to motion and that the resultant motion related stresses applied to the loop-band device may generate electricity as its buckling loop, or elements thereof, alter shape or assume changed buckled modes. The loop-band devices of this invention may, therefore, also be useful in applications such as, but not limited to, energy harvesting from sources of motion such as, but not limited to, wind or wave motion, or a combination thereof.

DETAILED DESCRIPTION OF THE INVENTION

Figure 1:
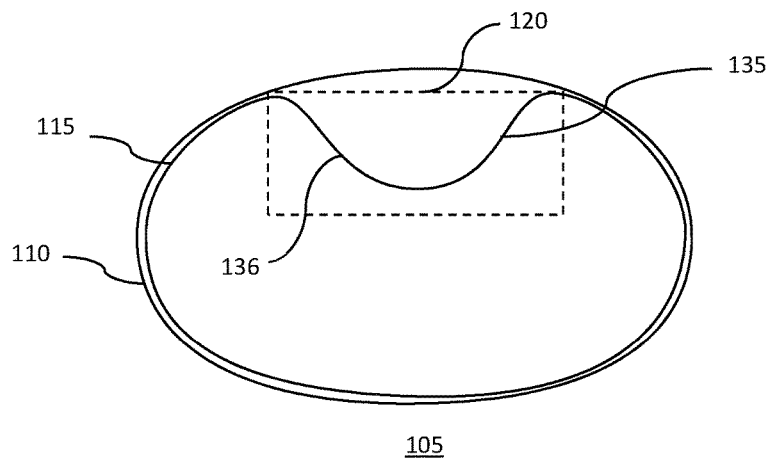
FIG. 1 shows a schematic cross-section of a loop-band device.

The preferred embodiments of the present invention will now be described in more detail with reference to the drawings in which identical elements in the various figures are, as far as possible, identified with the same reference numerals. These embodiments are provided by way of explanation of the present invention, which is not, however, intended to be limited thereto. Those of ordinary skill in the art may appreciate upon reading the present specification and viewing the present drawings that various modifications and variations may be made thereto without departing from the spirit of the invention.

FIG. 1 shows a schematic cross-section of a loop-band device of one embodiment of the present invention.

The loop-band device 105 may include a restraining loop 110 and a buckling loop 115. The buckling look may be constrained within the restraining loop in such a way that it assumes, or forms, a buckled shape, or buckled mode, having one or more buckles 120. Each of the buckles 120 may have a first and a second inflection point 135 and 136. By generating an activation force, a stress may be introduced into the buckling loop 115 that may cause it to change its shape, and in so doing result in a motion. The motion of the buckling loop changing shape may, for instance, result in a translation of the loop-band device 105 across a surface on which it may be resting.

Generating the activation force at, or in a vicinity of, one the points of inflection of one of the buckles may be the most efficient method of translating an applied activation force into motion of the loop-band device. However, there may be advantages to applying the activating force, at other sites. The activating force may, for instance, result in, or be a result of, a change in amplitude of a buckle, a bending moment, or change in angle of part of the buckling loop, or a change in curvature of a portion of the buckling loop. Applying such an activating force in a vicinity of where the buckling loop and the restraining loop begin to separate to form a buckle may, for instance, be a location at which the movement of the loop-band device may be most precisely controlled.

The restraining loop is preferably a continuous ribbon that has no end point and that may be of a uniform thickness and a uniform width. The width of the restraining loop is preferably greater than its thickness, and, the restraining loop is preferably of homogenous composition. A typical restraining loop may have a width that is at least 2× its thickness, though a width that is 5× or even 10× or more greater than its thickness is also known.

In a preferred embodiment, the loop-band device may include a restraining loop that may retain a buckling loop such that the buckling loop assumes, or forms, a buckled mode having one or more buckles. An activation force may then be generated within the buckling loop. The activation force may, for instance, be any force that results in a change of stress in the buckling loop. Depending on the composition of the buckling loop that stress may be generated via a means such as, but not limited to, heat, light, an electric current or voltage, a magnetic field, or a combination thereof. The result of the stress may be a change in the configuration of the buckling loop such that there is a movement of, or relative to, the restraining loop.

In a more preferred embodiment, activation force may be applied at, or in, the vicinity of an inflection point of one or more of the buckles, as this may result in an effective translation of activation force into loop-band device motion.

The buckling loop is preferably a continuous ribbon, having no end point and which may have a uniform thickness and a uniform width. The width of the buckling loop is preferably greater than the thickness of the buckling loop. A typical buckling loop may have a width that is at least 2× its thickness, though a width that is 5× or even 10× or more greater than its thickness is also known. While the buckling loop may be of homogenous composition, some embodiments may have buckling loops having patternings of varying composition. For instance, the buckling loop may interpose strips, or bands, of activatable elements between more inert elements.

Furthermore, the buckling layer may be of, or have portions that are of, a multilayer construction that may, for instance, include one or more interdigitated electrodes. Such interdigitated electrodes may, for instance, increase the effective capacitance of the structure, and so may increase the effective active area of the device.

Both the restraining and the buckling loops are preferably of seamless construction, though allowances for the manufacturing tolerances of joints may be made.

Figure 2:
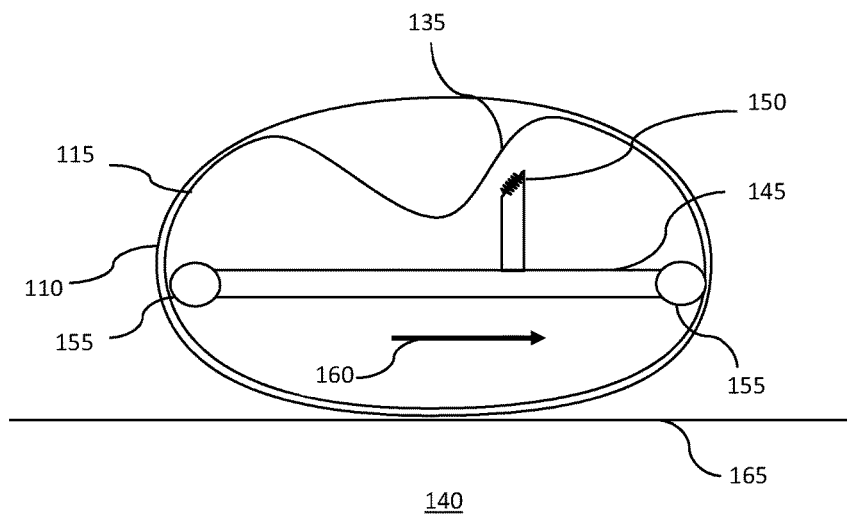
FIG. 2 shows a schematic cross-section of a loop-band device driven by a heat source.

FIG. 2 shows a schematic cross-section of a loop-band device driven by a heat source.

The loop-band device driven by a heat source 140 shown in FIG. 2 may, for instance, include a buckling loop 115 made of a suitably thin, relatively flexible, but springy material such as, but not limited to, a suitably thin metal, or metal alloy, that may have a suitably high coefficient of linear, thermal expansion. Although, theoretically, any material having a positive coefficient of linear expansion may be used, in a preferred embodiment of the invention, materials used may have a linear coefficient of expansion greater than $5 \times 10^{-6}$ m/m/° C. In a more preferred embodiment, the materials may be required to have a linear coefficient of expansion greater than $15 \times 10^{-6}$ m/m/° C. Suitable metals and metal alloys include, but are not limited to Aluminum Bronze, Beryllium Copper, Manganese Bronze, Nickel-Base Ally, S31000 Stainless Steel or some combination thereof.

The loop-band device driven by a heat source 140 may also include a restraining loop 110 and a carrying platform 145 that may have support rollers 155. The carrying platform 145 may be situated within the buckling loop 115 and be carrying a source of heat 150 located such that heat may be generated to, or in a vicinity of, a first inflection point 135. The application of the heat to the buckling loop 115 may cause local expansion, and therefore, stress, in a vicinity of the first inflection point 135. This stress may result in the buckling loop 115 deforming, and in doing so causing the loop-band device to move in a first lateral direction 160 along the substantially flat surface 165 on which the loop-band device may be resting.

The source of heat 150 may be any suitable source of heat such as, but not limited to, a flame, an electrical resistance heater, a light bulb, an LED light source, or a focused light source, or some combination thereof.

The restraining loop 110 may be made of any suitably thin, relatively inextensible yet flexible material such as, but not limited to, a fabric reinforced silicone, a fabric reinforced polyurethane, a Titanium alloy, a stainless steel alloy, a copper alloy or an aluminum alloy, or a combination thereof. Particularly suitable materials may include Titanium alloys such as, but not limited to, so called Beta titanium alloys, i.e., titanium alloyed in varying amounts with one or more of molybdenum, vanadium, niobium, tantalum, zirconium, manganese, iron, chromium, cobalt, nickel, and copper. This type of alloy may have a strength/modulus of elasticity ratios almost twice that of 18-8 austenitic stainless steel, allowing for larger elastic deflections in springs, and a reduced force per unit displacement. Suitable alloys may include, but are not limited to, "BETA III" (Ti-11.5 Mo-6.5 Zr-4.6 Sn), Transage 129 (Ti-2Al-11.5V-2Sn-11.3Zr) or Ti-6 Al-4V, or some combination thereof.

One of ordinary skill in the art will, however, appreciate that while FIG. 2 shows a loop-band device driven by a heat source 140, the buckling loop 115 may instead be made of a suitable electroactive polymer, and the heating source may then be replaced by a suitable electric current or voltage source, resulting in a loop-band device driven by an electromagnetic source.

The source of heat 150 shown in FIG. 2 may then, for instance, be replaced by an electrical current or voltage supplied by two separated conducting, contact rollers. Suitable materials for such an electroactive buckling loop may, for instance, be any electrostrictive materials having a piezoelectric voltage constant greater than $1 \times 10^{-3}$ V/mN/$m^2$. Particularly suitable polymers include polyvinylidene fluoride (PVDF) and Iodine doped polyacetylene Similarly, the buckling loop may be replaced by one made of a suitably magnetostrictive material, and the heat source by a source of magnetic flux to produce a magnetically driven loop-band device. A suitable magnetorestictive material may be one have a magnetostrictive coefficient greater than 50 microstrains such as, but not limited to, Terfenol-D, or Galfenol. Terfenol-D stands for Ter for terbium, Fe for iron, NOL for Naval Ordnance Laboratory, and D for dysprosium. It is a material that may exhibits about 2,000 microstrains in a field of 2 kOe (160 kA/m) at room temperature. A suitable source of magnetic flux may be a magnet such as, but not limited to, a suitably strong rare-earth permanent magnet, or an electro-magnet or a combination thereof.

Figure 3:
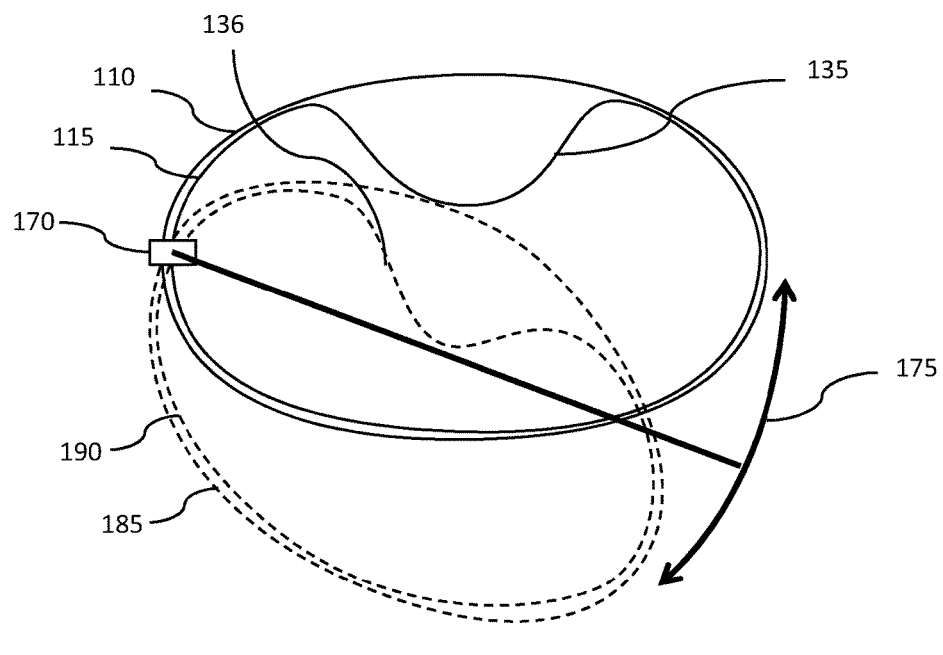
FIG. 3 shows a schematic cross-section of a single buckle loop-band device with a point of fixation.

FIG. 3 shows a schematic cross-section of a single buckle loop-band device with a point of fixation.

The single buckle loop-band device with a point of fixation 180 shown in FIG. 3 may include a restraining loop 110 and a buckling loop 115 held together at a point of fixation 170. The buckling loop 115 is shown having a buckle with a first inflection point 135. When an activating stress may be generated at the first inflection point 135, the buckling loop may deform to take up the shape shown as the buckling loop after motion 190. In assuming a change in shape because of the stress induced at the first inflection point 135, the entire loop-band device may be forced to move in an arc of motion 175 that may be centered on the point of fixation 170. The result of this motion may be the rotated loop-band device as represented by the buckling loop after motion 190 and the restraining loop after motion 185.

When the loop-band device is in the rotated position, as represented by the restraining loop after motion 185 and the buckling loop after motion 190 shown in FIG. 3, a further activating stress may be generated to the second inflection point 136. Application of this activating force, or stress, may result in the loop-band device being returned to its original orientation by rotation in an arc of motion 175 about the point of fixation 170.

Figure 4:
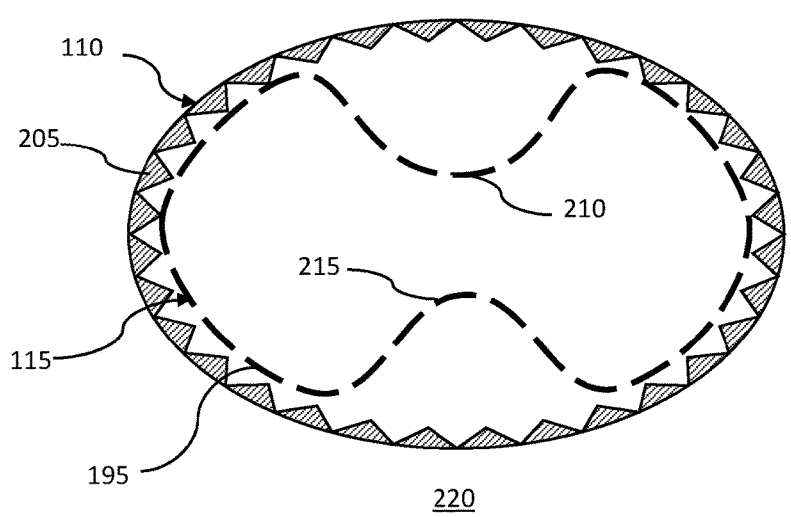
FIG. 4 shows a schematic cross-section of a two buckle loop-band device with engagement and location elements.

FIG. 4 shows a schematic cross-section of a two buckle loop-band device with engagement and location elements 220, having a first buckle 210 and a second buckle 215.

The restraining loop 110 may, for instance, have one or more engagements element 205 that may correspond in positioning to one or more locating elements 195 of the buckling loop 115. The engagement element 205 may, for instance, be teeth, and the locating element 195 may be holes or spaces into which the teeth may engage. An advantage of having corresponding engagement and locating elements may be to allow the buckling loop 115 to assume and maintain buckling modes, or configurations, having two or more buckles. Such buckling modes with multiple buckles may be termed to be higher eigen-mode buckling configurations.

Figure 5:
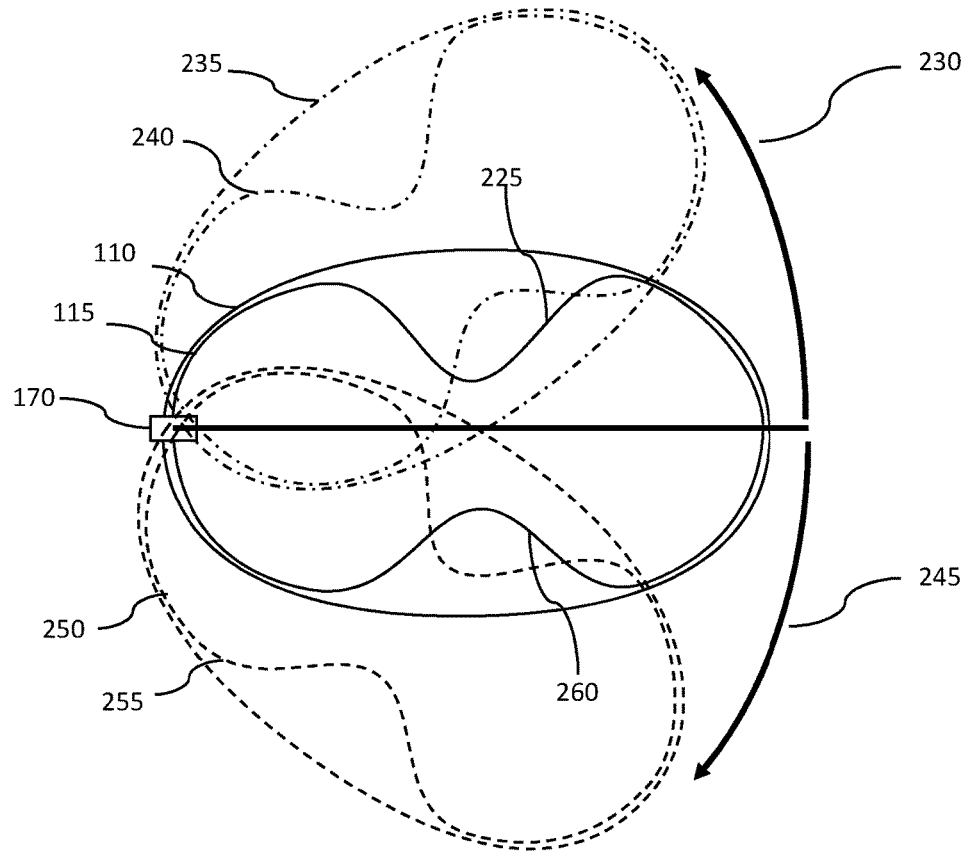
FIG. 5 shows a schematic cross-section of a two buckle loop-band device with a point of fixation.

FIG. 5 shows a schematic cross-section of a two buckle loop-band device 265 with a point of fixation.

As shown in FIG. 5, the loop-band device may initially have a form shown by the restraining loop 110 and the buckling loop 115 that may be restrained to form a buckled mode with two buckles. The restraining loop 110 and the buckling loop 115 may also be fixed together at a point of fixation 170 that may lie outside the buckled regions of the buckling loop.

An activation force may then be generated at a first inflection point 225 of a first buckle that may cause the buckling loop to change shape and in doing so cause the loop-band device to move in a first rotational direction 230 that may be an arc centered on the point of fixation. The result of the movement may be represented by the restraining loop 235 after motion in a first direction of rotation and the buckling loop 240 after motion in a first direction of rotation.

An activation force may instead have been generated a first inflection point 260 of a second buckle. Such a force may cause the buckling loop to change shape and in doing so cause the loop-band device to move in a second rotational direction 245 that may be an arc centered on the point of fixation. The result of the movement may be represented by the restraining loop 250 after motion in a second direction of rotation and the buckling loop 255 after motion in a second direction of rotation.

Figure 6:
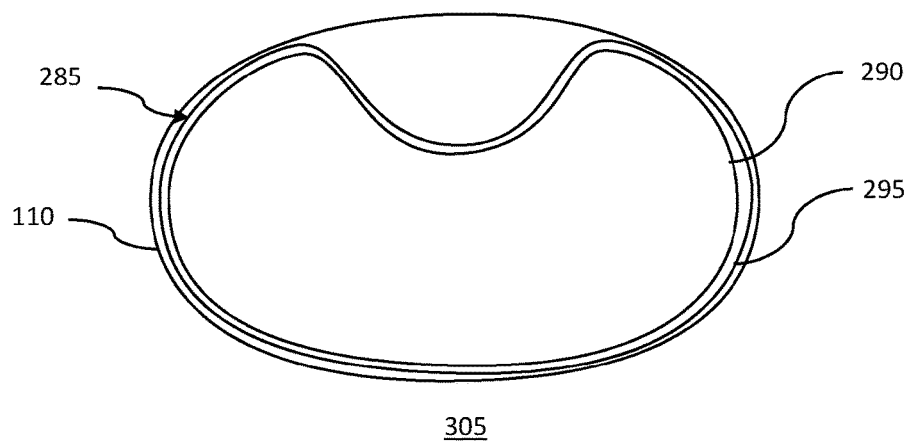
FIG. 6 shows a schematic, cross-section of a loop-band device with a bilayer buckling loop.

FIG. 6 shows a schematic, cross-sectional view of a loop-band device 305 with a bilayer buckling loop.

The bilayer buckling loop 285 may be made up of a substrate layer 290 and an active material layer 295.

The bilayer buckling loop substrate layer may, for instance, be made of a material such as, but not limited to, a fabric reinforced silicone, a fabric reinforced polyurethane, a Titanium alloy, a stainless steel alloy, a copper alloy or an aluminum alloy, or a combination thereof.

The bilayer buckling loop active material layer may be made of a material such as, but not limited to, an electroactive polymer selected from electrostrictive materials having a piezoelectric voltage constant greater than $1 \times 10^{-3}$ Vm/N, a magnetostrictive materials having a magnetostrictive coefficient greater than 50 microstrains, or a combination thereof; or a metal, or metal alloy, having a coefficient of linear, thermal expansion greater than $5 \times 10^{-6}$ m/m/° C.

Figure 7:
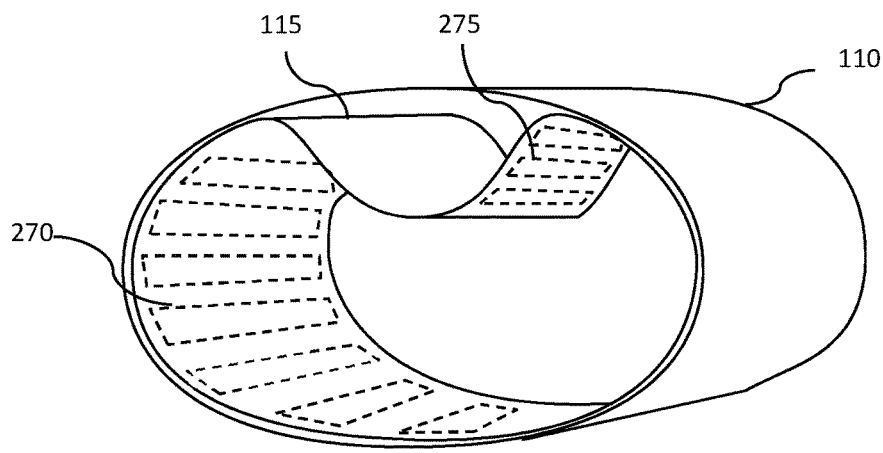
FIG. 7 shows a schematic, isometric view of a loop-band device with force generating elements.

FIG. 7 shows a schematic, isometric view of a loop-band device 280 with force generating elements.

The force generating elements 270 may be disposed on either the inner or outer surface of the buckling loop 115. The force generating elements 270 may themselves be flexible, or they may be rigid, or semi-rigid tiles, thus allowing the use of, for instance, ceramic piezo-electric elements as the force generating elements. A change in shape of the buckling loop 115 may, therefore, be effected by activating one or more of the force generating elements 275 located at, or in a vicinity of, an inflection point of the buckling loop 115. This change in shape of the buckling loop 115 may then result in relative motion of the bucking loop with respect to the restraining loop, and/or motion of the entire loop-band device with respect to a support surface.

Suitable materials for the force generating elements 270 include electroactive polymers such as, but not limited to, polyvinylidene fluoride (PVDF), and iodine doped polyacetylene, or some combination thereof. Ceramic electrostriction, known as relaxor ferroelectrics, such as, but not limited to, lead magnesium niobate (PMN), lead magnesium niobate-lead titanate (PMN-PT) and lead lanthanum zirconate titanate (PLZT), have extraordinarily high electrostrictive constants, and may, therefore, also be suitable as force generating elements 270.

For loop-band device with force generating elements 280 that may function by magnetostriction suitable materials include, but are not limited to, Terfenol-D™, Galfenol™, Metglas™ or some combination thereof.

As force generating elements 270 may be solids, piezo-electric materials such as, but not limited to, quartz, Lead zirconate titanate (PZT), and Barium titanate may be used as well as polymers such as, but not limited to, Poly vinyl carbonate (PVC), Nylon 11, and polyvinylidene fluoride (PVDF).

Figure 8:
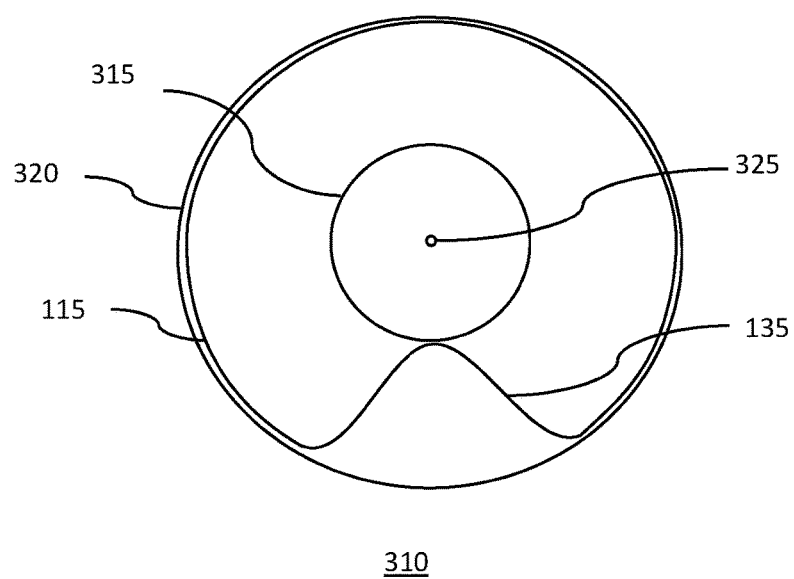
FIG. 8 shows a schematic, cross-section of a loop-band device configured for rotary motion.

FIG. 8 shows a schematic, cross-section of a loop-band device 310 configured for rotary motion.

In addition to the restraining loop and the buckling loop, a loop-band device 310 configured for rotary motion may include a inner, circular, rigid support structure 315 and the restraining loop may be reconfigured to be an outer, circular, rigid support structure 320 having the same axis of rotation 325 as the inner, circular, rigid support structure.

In such a structure, application of an activation force 130 at, for instance, the first inflection point 135 of the buckling loop may result in a rotatory motion of the outer, circular, rigid support structure 320 relative to the inner, circular, rigid support structure 315 about the axis of rotation 325.

Although this invention has been described with a certain degree of particularity, it is to be understood that the present disclosure has been made only by way of illustration and that numerous changes in the details of construction and arrangement of parts may be resorted to without departing from the spirit and the scope of the invention.

In particular, the embodiments of the invention have, in the main part, been illustrated using the lowest eigenvalue mode of buckling. One of ordinary skill in the art will, however, appreciate that the inventive principles and concepts described above may also apply to embodiments that incorporate the inventive concepts but which may use higher eigenvalue modes of buckling.

The invention claimed is:

1. A method of effecting motion using a loop-band device, comprising:
    providing a restraining loop, said restraining loop being a continuous ribbon of a uniform thickness and a uniform width and having no end point, and, wherein, said width is greater than said thickness, and, wherein, said restraining loop is of homogenous composition;
    providing a buckling loop, constrained within said restraining loop to form a buckled mode with one or more buckles, said buckling loop being a continuous ribbon of a uniform thickness and a uniform width and having no end point, and, wherein, said width is greater than said thickness; and
    generating an activation force within said buckling loop, thereby effecting a change of shape of said buckled mode and a movement of said restraining loop.

2. The method of claim 1, wherein, said activation force is generated at an inflection point of a first of one of said buckles.

3. The method of claim 1, wherein, said restraining loop comprises a material selected from one of a fabric reinforced silicone, a fabric reinforced polyurethane, a Titanium alloy, a stainless steel alloy, a copper alloy or an aluminum alloy, or a combination thereof.

4. The method of claim 3, wherein, said restraining loop comprises a fabric reinforced silicone.

5. The method of claim 1, wherein, said bucking loop is a bilayer buckling loop and comprises a substrate layer and an active material layer.

6. The method of claim 1, further comprising:
providing a carrying platform supported within said buckling loop; and
providing a source of heat, located on said carrying platform so as to provide heat to said inflection point, thereby generating said activation force and moving said loop-band device parallel to said carrying platform in a first lateral direction.

7. The method of claim 1, wherein said buckling loop is fixed to said restraining loop at a point of fixation outside of said buckles, thereby directing said movement of said restraining loop to be about an arc of motion centered on said point of fixation.

8. The method of claim 1, wherein, said restraining loop further comprises one or more engagement elements; and said buckling loop further comprises one or more locating elements.

9. The method of claim 8, wherein said buckling loop is fixed to said restraining loop at a point of fixation outside of said buckles, and wherein said buckling loop is constrained within said restraining loop to form a buckled mode with two of said buckles.

10. The method of claim 8, wherein generating said activation force at a first inflection point of said first buckle effects a movement of said restraining loop in a first rotational direction about said point of fixation; and providing a second activation force at a second inflection point of a second buckle effects a movement of said restraining loop in a second rotational direction about said point of fixation.

11. The method of claim 1, further comprising:
providing one or more force generating elements attached to, or a part of, said buckling loop; and
activating one of said force generating elements, thereby generating said activation force and effecting said movement of said restraining loop.

12. The method of claim 11, wherein said activated force generating element is located at an inflection point of one of said buckles.

13. The method of claim 11, wherein, said force generating element is a piezoelectric element.

14. The method of claim 1, further comprising:
providing an inner, circular, rigid support structure; and
wherein said restraining loop is an outer, circular, rigid support structure having a same axis of rotation as said inner, circular, rigid support structure, such that application of said activation force at said first inflection point results in rotatory motion of said outer, circular, rigid support structure relative to said inner, circular, rigid support structure about said axis of rotation.

15. A loop-band motion device, comprising:
a restraining loop, said restraining loop, said restraining loop being a contiguous ribbon of a uniform thickness and a uniform width and having no end, and, wherein, said width is greater than said thickness, and, wherein, said restraining loop is of homogenous composition;
a buckling loop, constrained within said restraining loop to form a buckled mode with one or more buckles, said buckling loop being a contiguous ribbon of a uniform thickness and a uniform width and having no end, and, wherein, said width is greater said thickness; and,
an activation force generated within said buckling loop, thereby effecting a change of shape of said buckled mode, and a movement of said restraining loop.

16. The loop-band motion device of claim 15, wherein, said activation force is generated at an inflection point of a first of said buckles.

17. The loop-band motion device of claim 15, wherein, said bucking loop is a bilayer buckling loop and comprises a substrate layer and an active material layer.

18. The loop-band motion device of claim 15, wherein said buckling loop is fixed to said restraining loop at a point of fixation outside of said buckles, thereby directing said movement of said restraining loop to be about an arc of motion centered on said point of fixation.

19. The loop-band motion device of claim 15, wherein, said restraining loop further comprises one or more engagement elements; and said buckling loop further comprises one or more locating elements.

20. The loop-band motion device of claim 15, further comprising:
an inner, circular, rigid support structure; and
wherein said restraining loop is an outer, circular, rigid support structure having a same axis of rotation as said inner, circular, rigid support structure, such that application of said activation force at said first inflection point results in rotatory motion of said outer, circular, rigid support structure relative to said inner, circular, rigid support structure about said axis of rotation.

* * * * *